US007606455B2

(12) United States Patent
Barrios et al.

(10) Patent No.: US 7,606,455 B2
(45) Date of Patent: Oct. 20, 2009

(54) LIGHT EMITTING SLOT-WAVEGUIDE DEVICE

(75) Inventors: Carlos Angulo Barrios, Toledo (ES); Michal Lipson, Ithaca, NY (US)

(73) Assignee: Cornell Research Foundation, Inc., Ithaca, NY (US)

( * ) Notice: Subject to any disclaimer, the term of this patent is extended or adjusted under 35 U.S.C. 154(b) by 189 days.

(21) Appl. No.: 11/595,828

(22) Filed: Nov. 10, 2006

(65) Prior Publication Data

US 2007/0114628 A1 May 24, 2007

Related U.S. Application Data

(60) Provisional application No. 60/735,313, filed on Nov. 11, 2005, provisional application No. 60/735,736, filed on Nov. 10, 2005.

(51) Int. Cl.
*G02B 6/10* (2006.01)
(52) U.S. Cl. ........................................ 385/131; 385/132
(58) Field of Classification Search ......... 385/129–132, 385/141
See application file for complete search history.

(56) References Cited

U.S. PATENT DOCUMENTS 5,438,639 A * 8/1995 Ford et al. ..................... 385/30
6,118,908 A * 9/2000 Bischel et al. ................. 385/14

OTHER PUBLICATIONS

"Atlas Device Simulation Feedback", [online]. (c) 1984-2005 Silvaco International. [retrieved on Nov. 2, 2005]. Retrieved from the Internet: <URL: http://web.archive.org/web/20051102115308/http://www.silvaco.com/products/device_simulation/atlas.html>, 2 pgs.
"FullWave Version 2.0e", [online]. RSOFT Design Group. [archived on Aug. 29, 2005]. Retrieved from the Internet: <URL: http://web.archive.org/web/20050829184251/http://www.rsoftinc.com/fullwave.htm>, 1 pg.
"International Search Report for corresponding PCT Application No. PCT/US2006/043731", (Mar. 20, 2007), 5 pgs.
"Written Opinion of the International Searching Authority for corresponding PCT Application No. PCT/US2006/043731", (Mar. 20, 2007), 7 pgs.
Almeida, V. R., et al., "All-Optical Control of Light on a Silicon Chip", *Nature*, 431(7012), (2004), 1081-1084.
Almeida, V. R., et al., "Guiding and Confining Light in Void Nanostructure", *Optics Letters*, 29(11), (2004), 1209-1211.
Almeida, V. R., et al., "Light Guiding in Low Index Materials Using High-Index-Contrast Waveguides", *Materials Research Society Symposium Proceedings*, vol. 797, (2004), W6.10.1-W6.10.6.

(Continued)

*Primary Examiner*—Charlie Peng
(74) *Attorney, Agent, or Firm*—Schwegman, Lundberg & Woessner, P.A.

(57) ABSTRACT

An electroluminescent material slot waveguide generates light in response to current injection. In one embodiment, the waveguide is formed as part of an optical resonator, such as ring resonator waveguide or distributed Bragg reflector with an anode and cathode for electrical stimulation. A compact, electrically-driven resonant cavity light emitting devices (RCLED) for Si microphotonics may be formed. Several different rare-earth ions, such as erbium, terbium and ytterbium, can be used to dope $SiO_2$ in order to emit light at different wavelengths.

23 Claims, 8 Drawing Sheets
(2 of 8 Drawing Sheet(s) Filed in Color)

OTHER PUBLICATIONS

Baehr-Jones, T., et al., "High-Q Optical Resonators in Silicon-On-Insulator-Based Slot Waveguides", *Applied Physics Letters*, 86(8), (2005), 081101-1-081101-3.

Baehr-Jones, T., et al., "Optical Modulation and Detection in Slotted Silicon Waveguides", *Optics Express*, 13(14), (2005), 5216-5226.

Barrios, C. A., et al., "Electrically Driven Silicon Resonant Light Emitting Device Based on Slot-Waveguide", *Optics Express*, 13(25), (2005), 10092-10101.

Barrios, C. A., et al., "Electrooptic Modulation of Silicon-on-Insulator Submicrometer-Size Waveguide Devices", *Journal of Lightwave Technology*, 21(10), (2003), 2332-2339.

Barrios, C. A., "High-Performance All-Optical Silicon Microswitch", *Electronics Letters*, 40(14), (2004), 862-863.

Castagna, M. E., et al., "High Efficiency Light Emitting Devices in Silicon", *Materials Science and Engineering B*, 105(1), (2003), 83-90.

Gnan, M., et al., "Coupled Microcavity in Phononic Wire Bragg Grating", *Conference on Light and Electro-Optics (CLEO), Paper CWG7*, (2004), 2 pgs.

Kik, P. G., et al., "Erbium Doped Optical Waveguide Amplifiers on Silicon", *Materials Research Society Bulletin*, 23(4), (1998), 48-54.

Koonath, T., et al., "Vertically-Coupled Micro-Resonators Realized Using Three-Dimensional Sculpting in Silicon", *Applied Physics Letters*, 85(6), (2004), 1018-1020.

Liao, L., et al., "High Speed Silicon Mach-Zehnder Modulator", *Optics Express*, 13(8), (2005), 3129-3135.

Lipson, M., et al., "Erbium in Si-Based Light Confining Structures", *Materials Science and Engineering B*, 81, (2001), 36-39.

Liu, A., et al., "A High-Speed Silicon Optical Modulator Based on a Metal-Oxide-Semiconductor Capacitor", *Nature*, 427, (2004), 615-618.

Rong, H., et al., "A Continuous-Wave Raman Silicon Laser", *Nature*, 433(7027), (2005), 725-728.

Soref, R. A., et al., "Kramers-Koenig Analysis of E-O Switching in Silicon", *Proceedings, International Society of Optical Engineers (SPIE)—Integrated Optical Circuit Engineering IV*, vol. 704, (1986), 32-37.

Xu, Q., et al., "Experimental Demonstration of Guiding and Confining Light in Nanometer-Size Low-Refractive-Index Material", *Optics Letters*, 29 (14), (2004), 1626-1628.

Xu, Q., et al., "Micrometre-Scale Silicon Electro-Optic Modulator", *Nature*, 435(7040), (2005), 325-327.

Yariv, A., "Universal Relations for Coupling of Optical Power Between Microresonators and Dielectric Waveguides", *Electronics Letters*, 36(4), (2000), 321-322.

\* cited by examiner

US 7,606,455 B2

LIGHT EMITTING SLOT-WAVEGUIDE DEVICE

RELATED APPLICATION

This application claims priority to U.S. Provisional Application Ser. No. 60/735,736 (entitled LIGHT EMITTING SLOT-WAVEGUIDE DEVICE, filed Nov. 10, 2005) and to U.S. Provisional Application Ser. No. 60/735,313 (entitled LIGHT EMITTING SLOT-WAVEGUIDE DEVICE, filed Nov. 11, 2005) which are both incorporated herein by reference.

FIELD OF THE INVENTION

The present invention relates to light emitting devices, and in particular to a light emitting slot-waveguide device.

BACKGROUND OF THE INVENTION

Recent breakthroughs have boosted the interest in silicon based microphotonics as a technology for integrating optical and electronic components on a single silicon chip. In particular, the demonstration of a continuous-wave optically-pumped Si laser has been of special relevance. However, such a device is optically-pumped and emits at 1.686 µm wavelength, limiting its practical applications.

SUMMARY OF THE INVENTION

An electroluminescent doped slot waveguide generates light in response to current injection. In one embodiment, the waveguide is formed as part of an optical resonator, such as ring waveguide or distributed Bragg reflector. A compact, electrically-driven resonant cavity light emitting devices (RCLED) for Si microphotonics may be formed. In one embodiment, several different rare-earth ions, such as erbium, terbium and ytterbium, can be used to dope SiO2 in order to emit light at different wavelengths.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION OF THE INVENTION

Figure 1A:
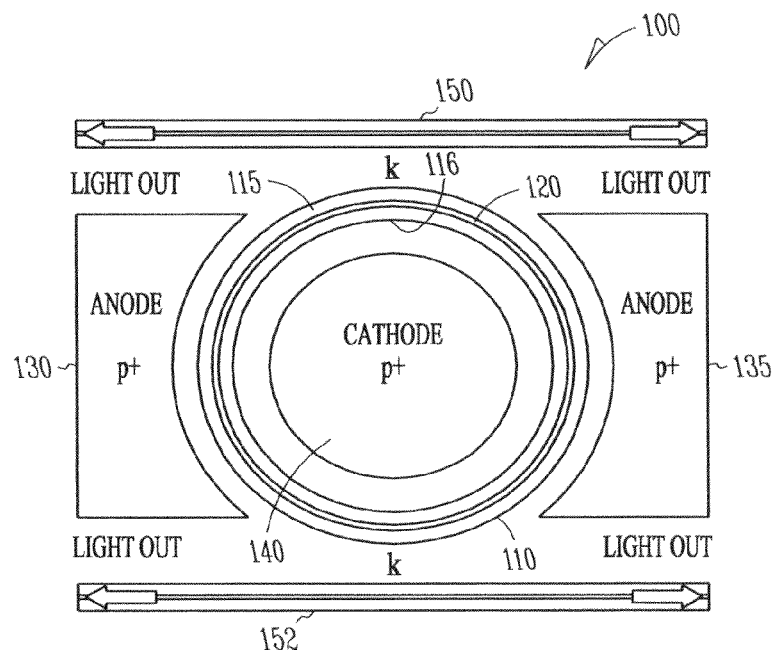
FIG. 1A is a schematic top view of a light emitting slot waveguide device in accordance with an example embodiment.

In the following description, reference is made to the accompanying drawings that form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the scope of the present invention. The following description is, therefore, not to be taken in a limited sense, and the scope of the present invention is defined by the appended claims.

A silicon in-plane micron-size electrically-driven resonant cavity light emitting device (RCLED) is based on slotted waveguide. The device consists of a micro-ring resonator formed by a $Si/SiO_2$ slot-waveguide with a low-index electroluminescent material (such as Erbium-doped $SiO_2$ or other types of electroluminescent materials including rare earth metals) in the slot region. The geometry of the slot-waveguide permits the definition of a metal-oxide-semiconductor (MOS) configuration for the electrical excitation of the active material. Simulations predict a quality factor Q as high as 33,000 for a 40-µm-radius electrically-driven micro-ring RCLED capable to operate at a very low bias current of 1.5 nA. Lasing conditions are also discussed.

An electrically-driven Si light emitting device (LED) is desirable since it can be considered as the natural interface between photonics and electronics such as CMOS technology. In addition, emission at approximately 1.5-µm-wavelength is also desirable for applications in the telecommunication field.

Si LEDs based on metal-oxide-semiconductor (MOS) structures with Er implanted in the thin gate oxide have shown external quantum efficiencies as high as 10%, which is comparable to that of standard III-V semiconductors LEDs. By current injection through the MOS structure, energetic (hot) electrons can excite Er ions by impact ionization and generate electroluminescence at 1.54 µm.

An optical cavity can enhance the external quantum efficiency of LEDs and it is an essential element for a laser. In order to be employed with the aforementioned Er-doped $SiO_2$ active material for on-chip applications, an optical cavity should: 1) permit electrical injection, 2) present a high optical mode-active material overlap, 3) be made of CMOS-compatible materials, 4) be micron-size, and 5) exhibit a high quality-factor Q. A planar waveguide-based cavity, such as a ring or disk resonator, can provide a long light-matter interaction path. However, Er-doped $SiO_2$ has low refractive index and, therefore, a conventional strip waveguide using this material as the core would present two important drawbacks: a) waveguides would require a large cross-section area, which makes difficult current injection through the thick oxide, and b) the low-index-contrast system $SiO_2$/air does not facilitate miniaturization.

A novel guided-wave slot structure, enables concentration of a large fraction of the guided mode into a thin low-index layer (slot) sandwiched between two high-index strips. In on embodiment, two doped Si strips (electrodes), sandwich a thin Er-doped-SiO$_2$ slot layer (gate oxide). Current injection through the gate oxide results in generation of light in the oxide-slot region where the guided-mode is strongly confined. In one embodiment, 50-µm-diameter high-Q (~20,000) optical resonator in silicon-on-insulator based on slot-waveguides had losses as low as 10 dB/cm. Using these advantageous characteristics of the slot-waveguide geometry, compact electrically-driven resonant cavity light-emitting devices (RCLED) for Si microphotonics are obtained.

FIG. 1A shows a schematic diagram of a MOS slot waveguide light emitting device 100. It consists of a microring resonator formed by a slot-waveguide 110, also referred to as a body. In one embodiment, the slot-waveguide 110 includes a pair of high index of refraction rings of silicon 115, 116 that sandwich a concentric ring 120 of Er-doped-SiO$_2$, referred to as the slot layer 120. The slot layer 120 has a relatively low index of refraction compared to the high index Si rings 115, 116.

In one embodiment, anode sections 130, 135 are formed outside of the slot-waveguide 110, and a cathode 140 is formed inside the slot-waveguide 110. In one embodiment, both the anode 135 and cathode 140 are p+ doped. One or more waveguides 150, 152 may be formed adjacent the slot-waveguide 110 such that they are optically coupled to the slot-waveguide 120 for providing light output from the slot-waveguide. The positioning of the anode and cathode areas may be altered such that they still provide current injection via the slot layer 120 when current flows from anode to cathode. SiO$_2$ may be used to cover the whole device as shown at 160.

Figure 1B:
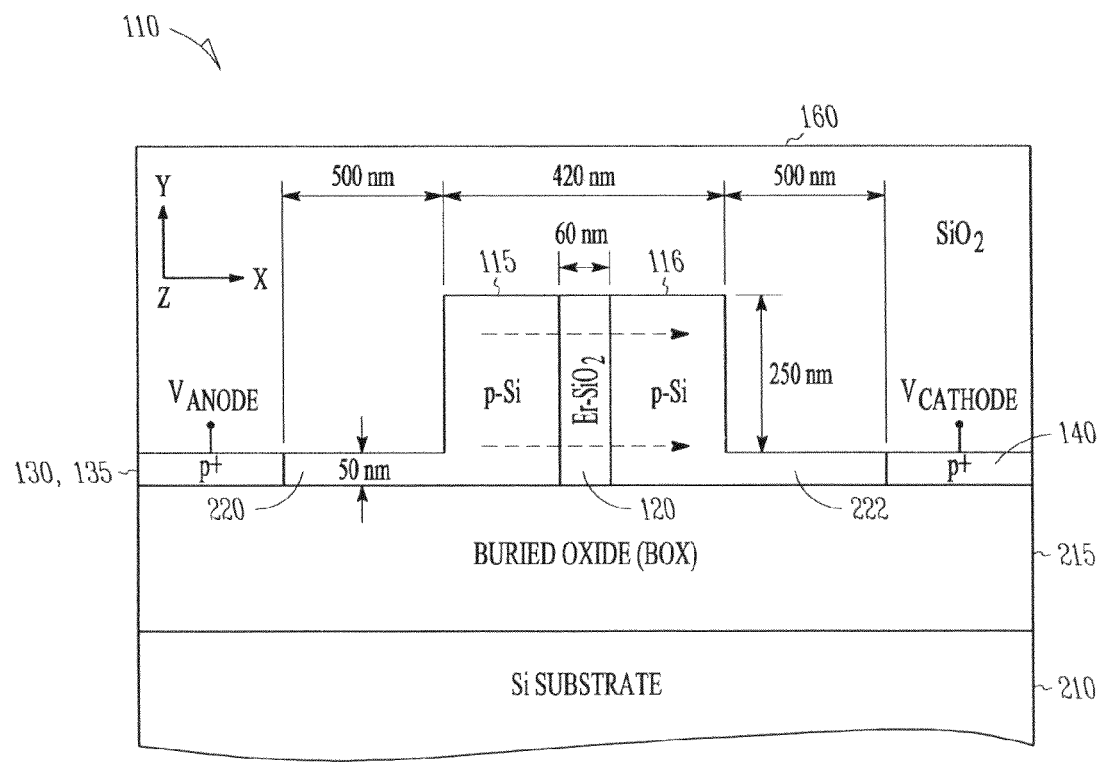
FIG. 1B is a schematic cross section view of the light emitting slot waveguide device of FIG. 1B.

A schematic cross-section of the slot-waveguide 110 forming the ring is illustrated in FIG. 1B. A silicon-on-insulator (SOI) platform comprises a silicon substrate 210 with a buried oxide layer 215. In one example embodiment, a 60-nm-wide Er-doped-SiO$_2$ region (slot) 120 is sandwiched between two 300-nm-tall and 180-nm-wide p-type doped (p=10$^{18}$ cm$^{-3}$) Si stripes corresponding to rings 115, 116. Thin 50-nm-thick slabs or strips 220, 222 are introduced for defining highly doped p-type (p=10$^{19}$ cm$^{-3}$) Si regions corresponding to anodes 130, 135 and cathode 140. The slabs 220 and 222 provide some separation between the silicon rings and electrodes in one embodiment.

The optical mode characteristics of the slot-waveguide may be calculated by employing a beam propagation method (BPM). The transmission characteristics of an example bus-coupled micro-ring were calculated by using the transfer matrix method. The refractive indexes of undoped Si and SiO$_2$ (and Er-doped SiO$_2$) were assumed to be 3.48 and 1.46, respectively. The real refractive index and absorption coefficient of the doped Si regions due to the free-carrier dispersion are calculated by using the relations:

$$\Delta n = \Delta n_e + \Delta n_h = -[8.8 \times 10^{-22} \cdot \Delta N + 8.5 \times 10^{-18} \cdot (\Delta P)^{0.8}] \quad (1)$$

$$\Delta \alpha = \Delta \alpha_e + \Delta \alpha_h = 8.5 \times 10^{-18} \cdot \Delta N + 6.0 \times 10^{-18} \cdot \Delta P \quad (2)$$

where $\Delta n_e$ is the refractive index change due to electron concentration change;

$\Delta n_h$ is the refractive index change due to hole concentration change;

$\Delta N$ is the electron concentration change in cm$^{-3}$;

$\Delta P$ is the hole concentration change in cm$^{-3}$;

$\Delta \alpha_e$ (in cm$^{-1}$) is the absorption coefficient variations due to $\Delta N$;

$\Delta \alpha_h$ (in cm$^{-1}$) is the absorption coefficient variation due to $\Delta P$.

A two-dimensional (2-D) semiconductor device modeling software, ATLAS from SILVACO, was employed to calculate the DC electric-field across the gate oxide of the biased structures.

Optical Characteristics

Figure 2:
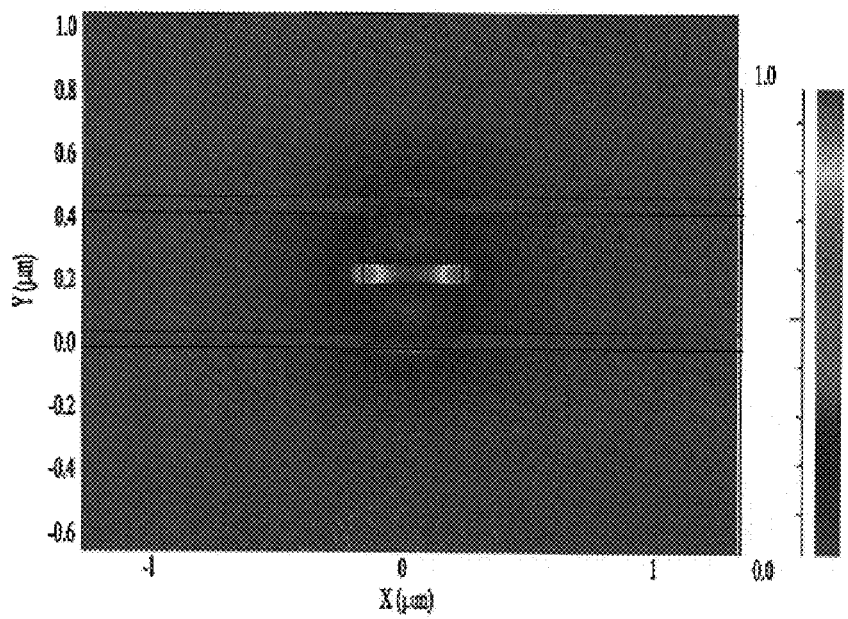
FIG. 2 is a graph illustrating an optical field distribution for quasi-TE optical mode perpendicular to the slot for the light emitting slot waveguide device of FIG. 1A.

FIG. 2 illustrates the optical field distribution for the quasi-TE (major E-field component perpendicular to the Si/slot interface) for an example slot-waveguide constructed in accordance with FIGS. 1A and 1B. Results shown and described in the present application are not represented as average, best case or worse case. They are simply results obtained from one or more example devices constructed in accordance with the described embodiments. The operating wavelength was 1.54 µm. The optical field is strongly confined in the low-index slot region 120. The maximum normalized power in the slot 120 (with respect to the total power in the waveguide) was estimated to be around 30%. The effective refractive index was calculated to be $n_{eff}$=1.9659+j9.24×10$^{-6}$. The imaginary part (absorption constant) of $n_{eff}$ represents an absorption coefficient of 3.2 dB/cm. Note that the latter value is smaller than that exhibited by the doped (p=10$^{18}$ cm$^{-3}$) Si rings (6 dB/cm). This is because only a small fraction of the optical mode is located in the highly lossy Si regions, as revealed in FIG. 2. This is a unique feature of the slot-waveguide that enables the use of high-index lossy materials (for example, for defining electrodes) without introducing excessive optical losses, which is especially useful in the design of high performance electro-optic devices.

Figure 3:
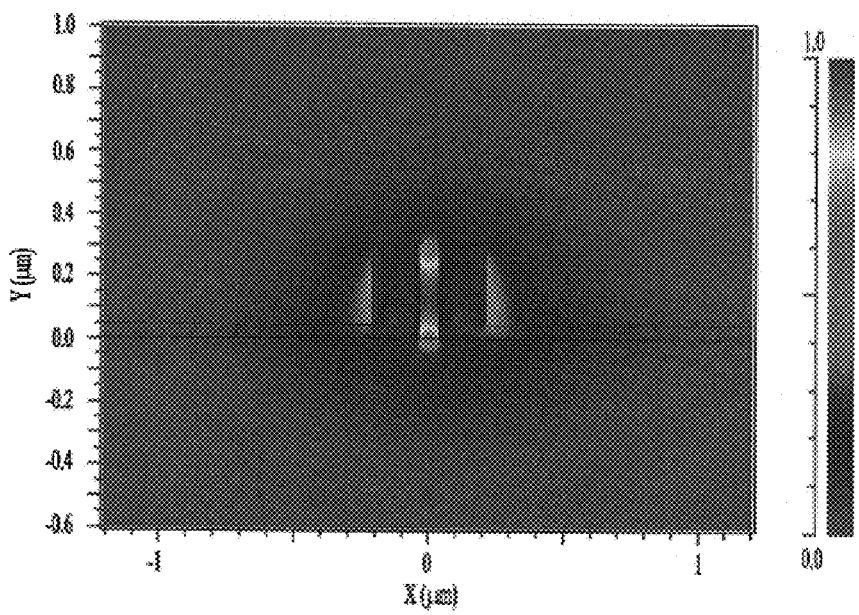
FIG. 3 is a graph illustrating an optical field distribution for quasi TE optical mode in a bent slot waveguide turning to the left according to an example embodiment.

FIG. 3 shows the quasi-TE optical mode distribution in a bent slot-waveguide turning to the left (-x axis) with a radius of curvature of 40 µm. It is seen that the optical field is still strongly concentrated in the slot region and slightly shifts to the right side (+x axis) due to the bending effect. The effective refractive index of the bent slot-waveguide was calculated to be $n_{eff,bend}$=1.9666+j9.99×10$^{-6}$, which corresponds to an absorption coefficient of $\alpha_{bend}$=3.5 dB/cm. In addition to losses due to free-carrier absorption, radiation loss ($\alpha_{rad}$) associated with the bend must be considered. BPM simulations revealed radiation loss of 2.9 dB/cm for a radius of curvature of 40 µm.

In order to estimate the performance of an example micro-ring resonator 110 illustrated in FIG. 1A, the following parameters were used: radius (R)=40 µm, power-coupling coefficient ($|\kappa|^2$)=0.025, and optical losses $\alpha = \alpha_{scattering} + \alpha_{bend} + \alpha_{rad}$. $\alpha_{scattering}$ represents the optical losses in the slot-waveguide due to scattering at the sidewalls of the Si rails, which has been experimentally determined to be ~10 dB/cm. Thus, $\alpha$=16.4 dB/cm and the total internal loss in the ring, $A_i = \alpha 2\pi R$=0.41 dB. The ring radius should satisfy the condition $2\pi R = m(\lambda_{emission}/n_{eff,bend})$, where m is an integer, in order to have a resonance at the emission wavelength $\lambda_{emission}$=1540 nm.

Figure 4:
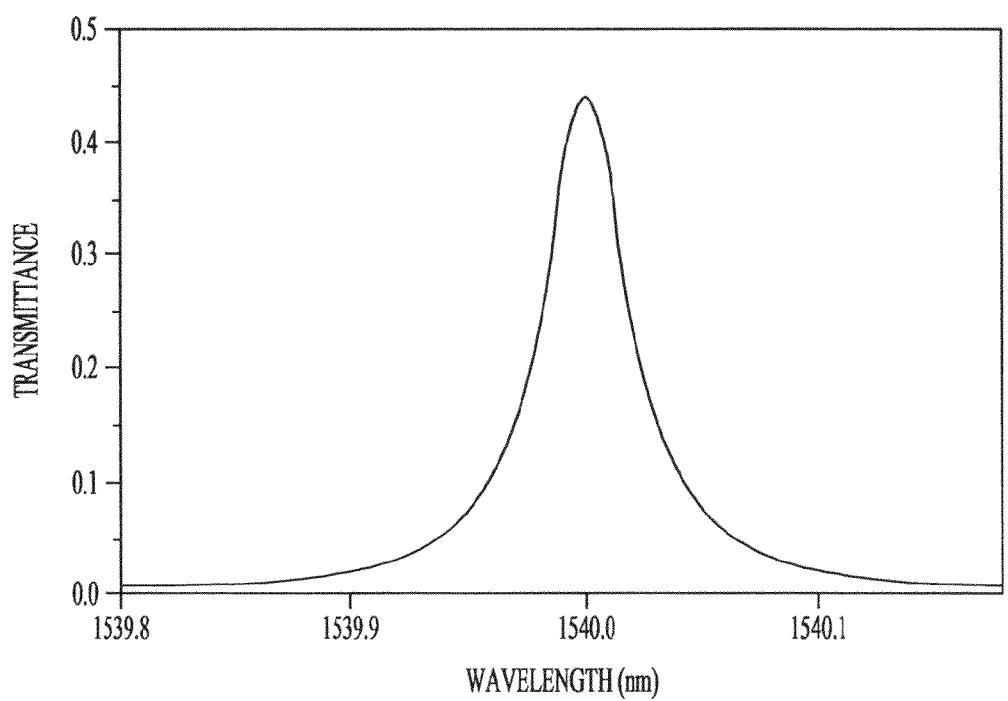
FIG. 4 is a graph illustrating spectral transmittance of the light emitting slot waveguide device of FIG. 1A.

FIG. 4 shows the transmittance characteristics of the micro-ring 110. The calculated quality factor Q, defined as the ratio of the resonance frequency ($\omega_r$) to the full width at half maximum of the resonance ($\Delta \omega$), is Q=$\omega_r/\Delta \omega$=3.3×10$^4$. This value is two orders of magnitude higher than that exhibited by vertical Fabry-Perot cavities formed by multilayer Si/SiO$_2$ Distributed Bragg Reflectors. Since the emission wavelength, which corresponds to the Er ions sharp luminescence, is in resonance with the cavity mode, the emitted light can be enhanced by orders of magnitude. Note also that the calculated Q corresponds to a passive ring; if optical gain is achieved in the active material a narrower resonance peak, and higher Q, could be obtained.

Laser oscillation may occur if the following condition is satisfied: $a(1-|\kappa|^2)=1$, where a is the inner circulation factor. For $|\kappa|^2=0.025$, $a=1.0256$, which corresponds to a net optical gain of 8.64 dB/cm. Since the internal loss is $\alpha=16.4$ dB/cm, the total optical gain needed for lasing would be 25 dB/cm. At present, the material system $Er^{3+}$ in $SiO_2$ has exhibited optical gain when optically pumped, and the maximum total gain achieved so far is smaller than the calculated of 25 dB/cm. Lasing may be obtained with further reductions in waveguide losses through improvements in the processing of the slot-waveguides in order to reduce scattering, which is estimated to be the main source of loss in the proposed structure.

Electrical Characteristics

Figure 5A:
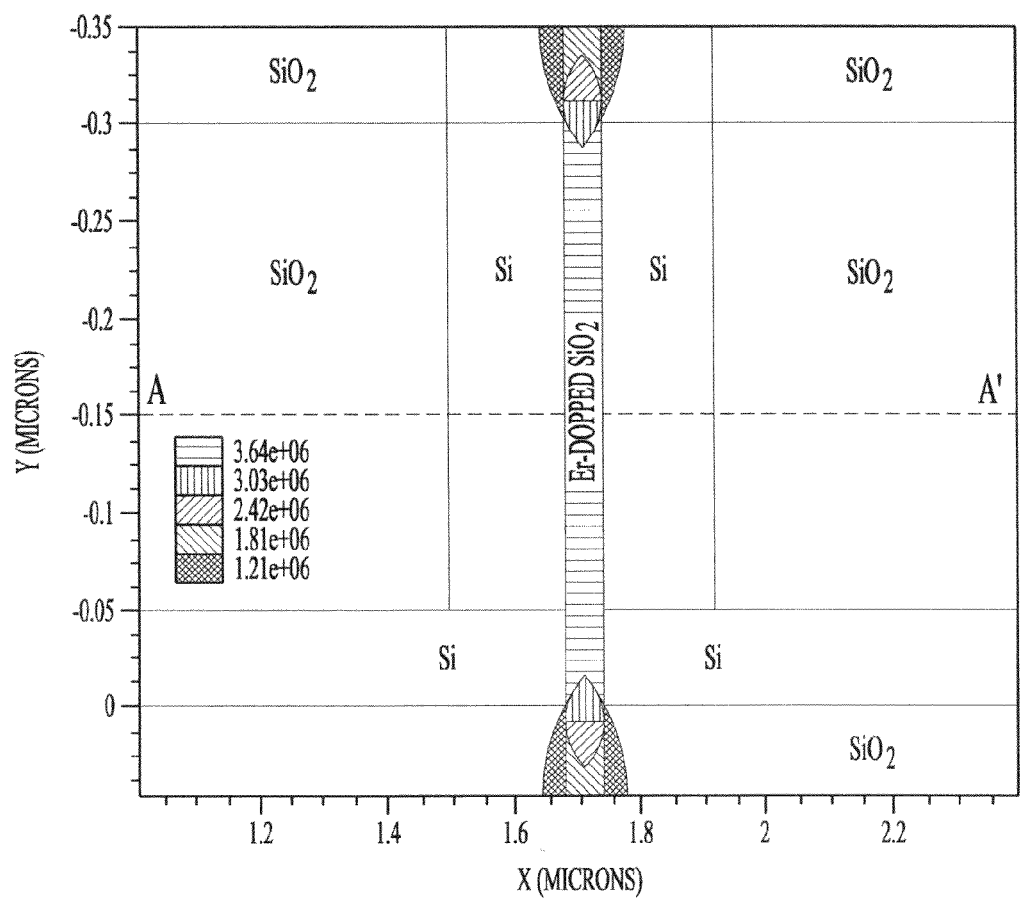
FIG. 5A is a graph illustrating two dimensional distribution of a DC electric field for an applied voltage.
Figure 5B:
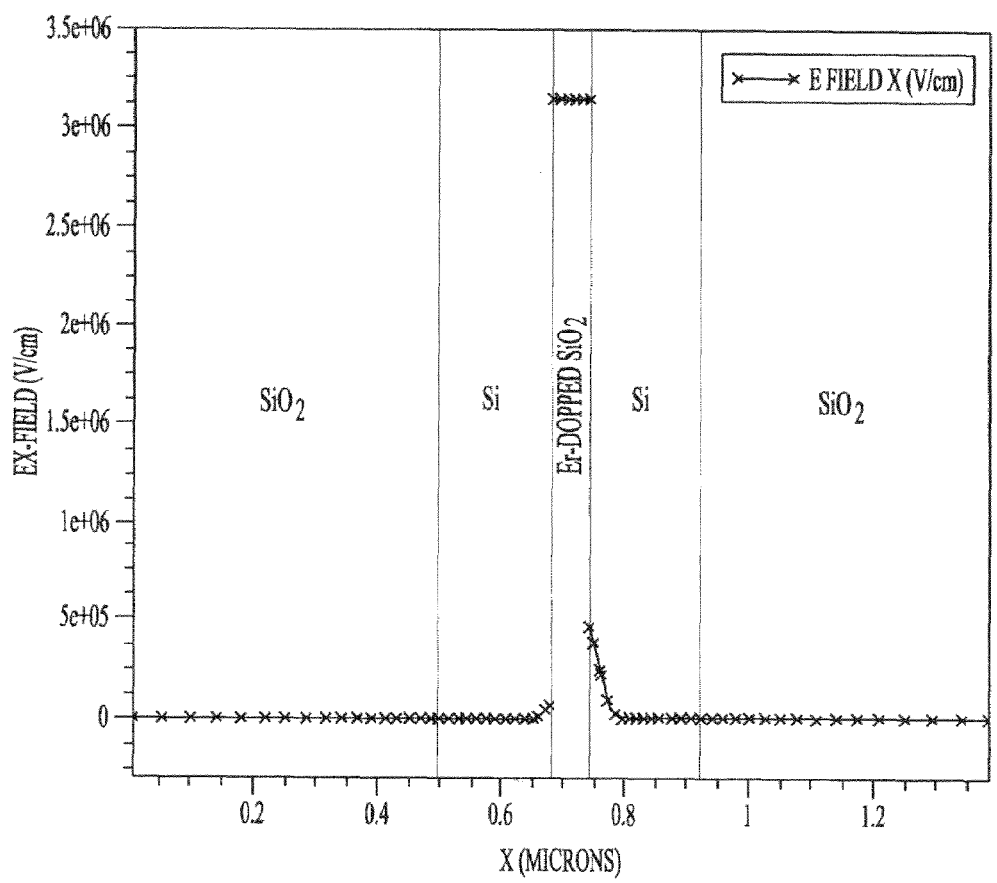
FIG. 5B illustrates a profile of the applied electric field in FIG. 5A.

FIG. 5 shows the 2-D distribution of the dc electric field for an applied voltage ($V_{anode}-V_{cathode}$) of 20 V. The transverse electric field in the slot region is nearly uniform and most of the applied voltage drops across the Er-doped $SiO_2$. This assures a uniform current injection through the gate oxide. The high conductivity of the doped ($p=10^{18}$ cm$^{-3}$) Si strips 220, 222 permits placement of the lossy electrode regions ($p=10^{19}$ cm$^{-3}$) 130, 135, and 140 far from the waveguide core, reducing significantly the optical losses of the waveguide. Carrier transport through the gate oxide in the studied devices can be attributed to Fowler-Nordheim (F-N) tunneling. Assuming an experimental value of 2 mA/cm$^2$ for the F-N current density needed to produce electroluminescence saturation in Er-doped $SiO_2$ MOS devices, the bias current for the slot-waveguide ring LED would be $I=J\cdot A_{ring}=(2 \text{ mA/cm}^2)\cdot(2\pi 40 \text{ μm}\cdot 0.3 \text{ μm})=1.5$ nA, where $A_{ring}$ is the area of the vertical surface of the active region (slot 120). Thus, if the needed voltage to achieve such a current density is 20 V, the power consumption would be only 30 nW. This small power consumption arises from the small area of the active area.

Other Configurations

Figure 6A:
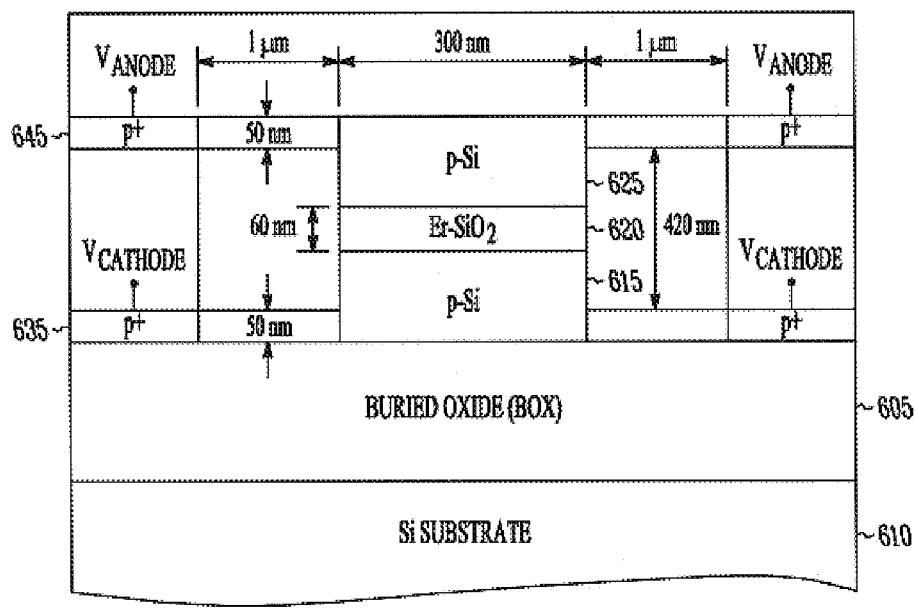
FIG. 6A is a schematic cross-sectional view of a horizontal slot waveguide according to an example embodiment.

Besides the vertical slot-waveguide configuration of FIGS. 1A and 1B, other configurations may be used such as a horizontal configuration 600 shown in FIG. 6A. The horizontal configuration 600 is formed on an oxide layer 605 formed on a silicon substrate 610 in one embodiment. A first silicon ring 615 is formed and supports a slot 620, followed by a second silicon ring 625. Slabs 630 are formed on either side of the first silicon ring and the cathode 635 is also formed spaced from the rings. Further slabs 640 are formed on either side of the second silicon ring 625 along with anode 645.

Figure 6B:
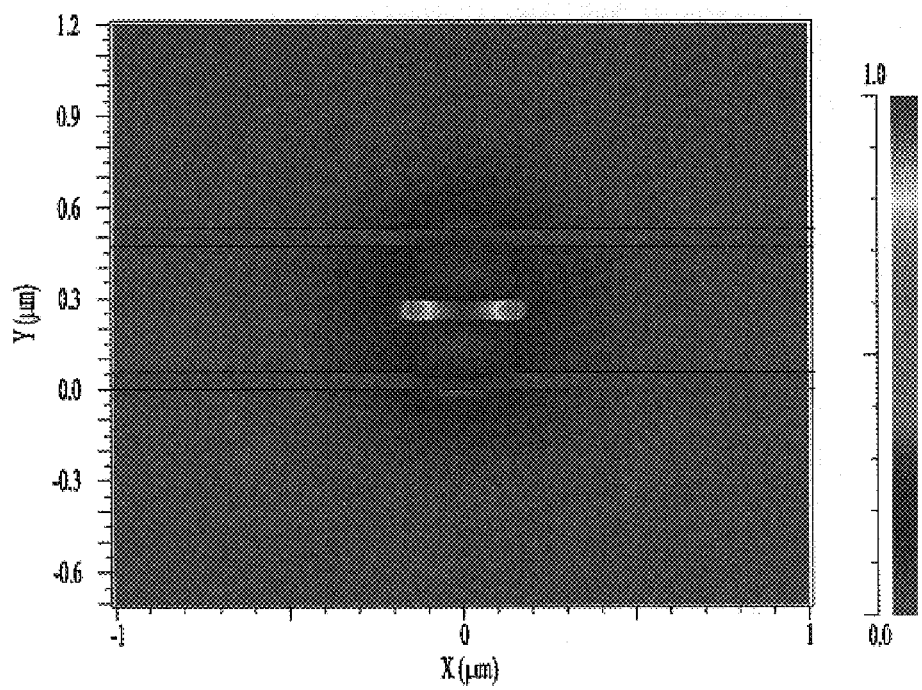
FIG. 6B illustrates transverse electric field amplitude of the quasi-TM optical mode for the device in FIG. 6A.

In the horizontal configuration 600, the device would operate under quasi-TM polarization (major E-field component perpendicular to the Si/slot interface), as illustrated in FIG. 6B. The complex refractive index of the slot-waveguide shown in FIG. 6A was calculated to be $n_{eff}=2.1198+j1.11\times 10^{-5}$, which corresponds to an absorption coefficient of 3.9 dB/cm. This value is slightly larger than that exhibited by the vertical configuration due to the presence of more doped Si regions. The horizontal configuration can be advantageous in order to reduce scattering losses induced by imperfections at the Si/$SiO_2$ interfaces. This is because a horizontal slot-waveguide could be fabricated by ion implantation (oxygen and erbium ions), deposition or lateral overgrowth epitaxial techniques, which would lead to much smoother interfaces than that produced by reactive ion etching techniques, used for the fabrication of vertical slot-waveguides.

Figure 7:
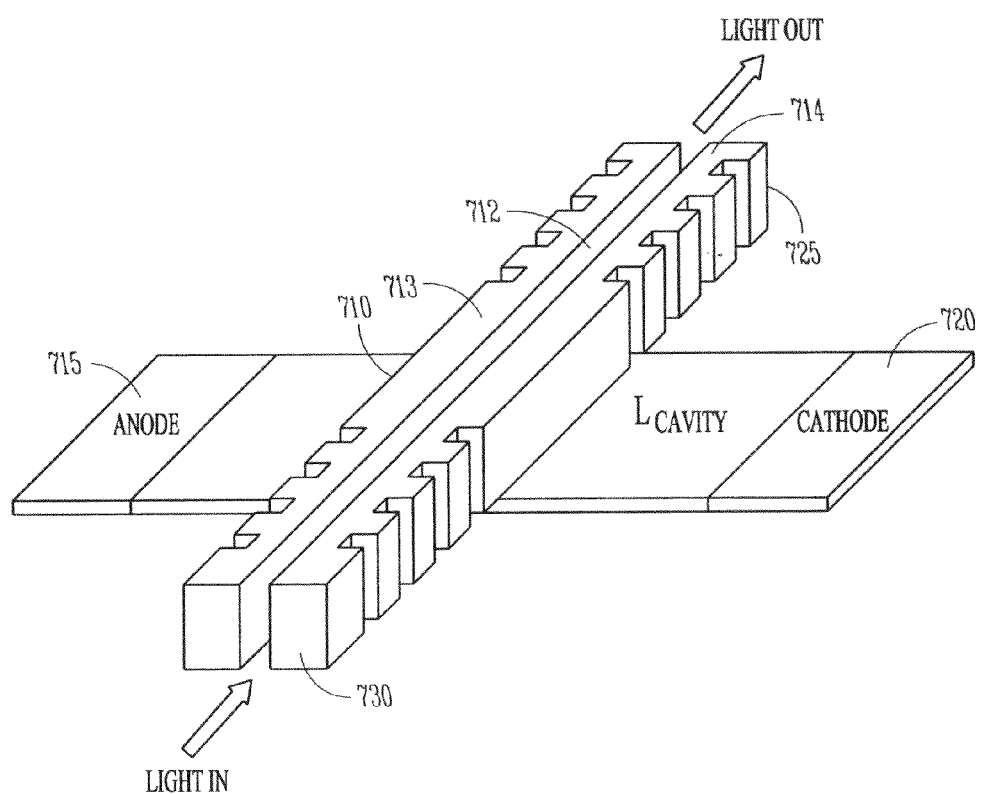
FIG. 7 is a perspective schematic view of a Fabry-Perot micro-cavity based slot-waveguide according to an example embodiment.

Besides a micro-ring resonator, a Fabry-Perot (F-P) microcavity defined by DBRs, such as that shown schematically in FIG. 7 may also be utilized for optical feedback. In this embodiment, a slot waveguide 710 is formed substantially straight with a slot portion 712 sandwiched by silicon portions 713 and 714. An anode 715 and cathode 720 are disposed on either side of the slot waveguide 710. Distributed Bragg Reflectors 725 and 730 are formed on both ends of the slot waveguide 710. Similar F-P cavities based on conventional strip photonic wire have been demonstrated on SOI substrates, exhibiting Q>1400.

Figure 8A:
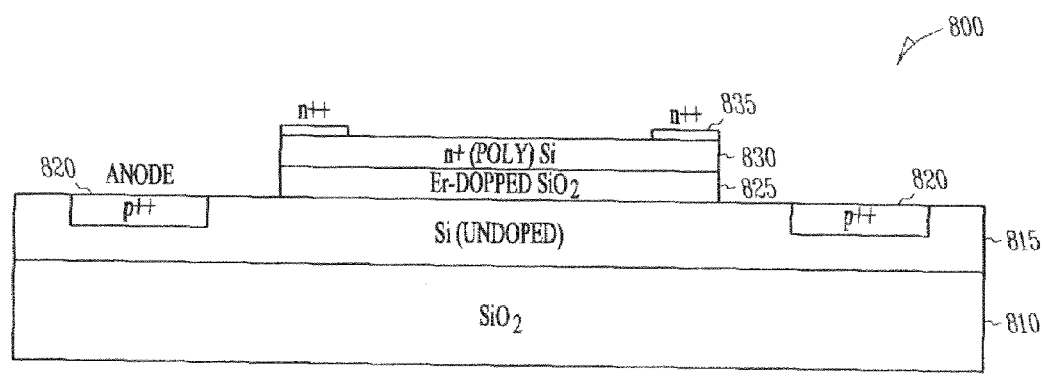
FIG. 8A is a schematic cross section of a further alternative light emitting slot-waveguide device according to an example embodiment.
Figure 8B:
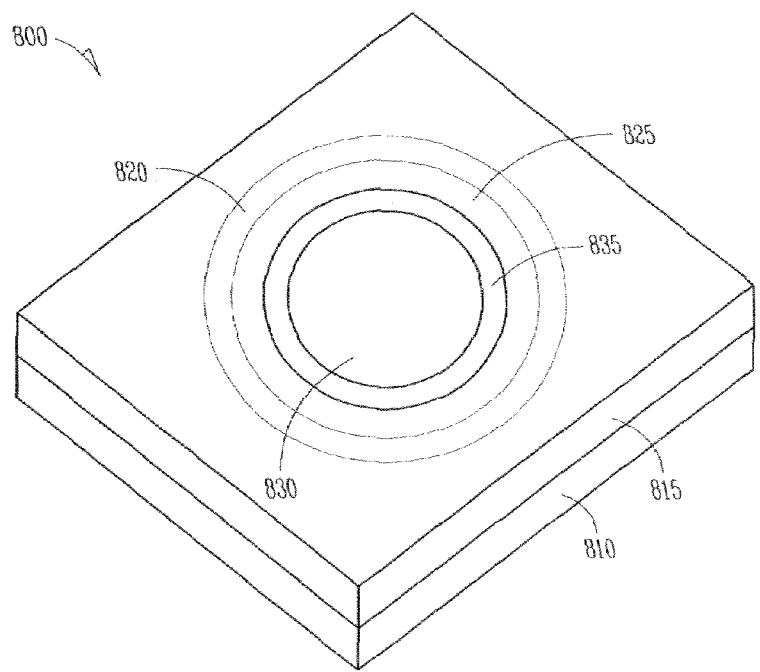
FIG. 8B is a schematic perspective view of the light emitting slot-waveguide device of FIG. 8A.

FIGS. 8A and 8B illustrate different views of a light emitting disk resonator 800 formed by a horizontal (stacked layers) Er-doped slot structure. In one embodiment, an insulating layer 810 is formed of $SiO_2$ or other material, and supports an undoped Si layer 815. A p++ doped ring anode 820 is formed in the Si layer 815, and an Er doped $SiO_2$ disk 825 is formed surrounded by the ring anode 820. An n+ doped polysilicon layer 830 is then formed on top of the disk 825, followed by formation of an n++ doped cathode ring 835 supported by the n+ doped polysilicon layer 830. In one embodiment, the cathode ring 835 is supported by the outer top portion of the n+ doped polysilicon layer 830. The n+ doped polysilicon layer 830 and Si layer 815, sandwich the Er doped disk 825, creating a light emitting slot waveguide. Injection currents created by a voltage across the anode 820 and cathode rings induce the Er doped $SiO_2$ disk 825 to emit light.

The Abstract is provided to comply with 37 C.F.R. § 1.72 (b) to allow the reader to quickly ascertain the nature and gist of the technical disclosure. The Abstract is submitted with the understanding that it will not be used to interpret or limit the scope or meaning of the claims.

The invention claimed is:

1. A light emitting device comprising:
   a slot waveguide formed as a resonator, wherein the slot waveguide further comprises:
   a first material and a second material having a high index of refraction;
   a slot formed between the first and second materials, the slot containing an electroluminescent material, and having a low index of refraction wherein an optical field is highly confined within the slot; and
   electrodes electrically coupled to inject current into the electroluminescent material.

2. The light emitting device of claim 1 wherein the slot waveguide is formed as a ring resonator.

3. The light emitting device of claim 1 wherein the slot waveguide is formed as a resonator having a middle portion with distributed Bragg reflectors formed on both sides of the middle portion.

4. The light emitting device of claim 1 and further comprising an anode and a cathode positioned on opposite sides of the slot waveguide.

5. The light emitting device of claim 4 wherein a voltage applied between the anode and cathode excite the electroluminescent material containing slot to generate light.

6. The light emitting device of claim 1 wherein the electroluminescent material comprises Er.

7. The light emitting device of claim 1 wherein the electroluminescent material comprises terbium or ytterbium.

8. The light emitting device of claim 1 wherein the electroluminescent material comprises a rare earth ion.

9. The light emitting device of claim 1 wherein an optical field propagates substantially in the low index slot.

10. A light emitting device comprising:
    a slot waveguide formed as a resonator, wherein the slot waveguide further comprises:
    a first and a second material formed of Si;
    a slot formed between the first and second material, the slot containing rare earth ion doped $SiO_2$ wherein an optical field is highly confined within the slot; and
    means for causing current to be injected into the rare earth ion doped $SiO_2$.

11. The light emitting device of claim 10 wherein the rare earth ion is selected from the group consisting of erbium, terbium and ytterbium.

12. The light emitting device of claim 10 wherein the means for causing current to be injected comprises an anode spaced apart from the body, and a cathode.

13. The light emitting device of claim 12 wherein the cathode is spaced apart from the body.

14. A light emitting device comprising:
  a slot waveguide formed as a resonator, wherein the slot waveguide further comprises:
  a first and a second layer of material, both having a high index of refraction;
  an electroluminescent slot formed between the first and second layers of material, the slot having a low index of refraction wherein an optical field is highly confined within the slot; and
  electrodes for causing current to be injected into the electroluminescent material.

15. The light emitting device of claim 14 wherein the electrodes comprise:
  a conductively doped anode slab coupled to the first layer; and
  a conductively doped cathode slab coupled to the second layer.

16. The light emitting device of claim 15 wherein the slot and the first and second layers are disks of silicon.

17. The light emitting device of claim 14 and further comprising an output waveguide optically coupled to the slot waveguide.

18. The light emitting device of claim 15 wherein the slot and the first and second layers are stacked layers.

19. The light emitting device of claim 15 wherein the first and second layers comprise p doped silicon and the electrodes comprise p+ doped silicon.

20. The light emitting device of claim 15 wherein the first layer comprises substantially undoped silicon, the slot comprises Er doped $SiO_2$, and the second layer comprises n+ doped polysilicon.

21. The light emitting device of claim 20 wherein the anode slab comprises p++ doped silicon formed in the first layer spaced apart from the slot, and the cathode comprises n++ doped silicon supported by the second layer.

22. The light emitting device of claim 21 wherein the electrodes comprise rings.

23. A light emitting device comprising:
  a slot waveguide formed as a resonator, wherein the slot waveguide further comprises:
  a first and a second layer of material, both having a high index of refraction;
  an electroluminescent slot formed between the first and second layers of material, the slot having a low index of refraction; and
  electrodes for causing current to be injected into the electroluminescent material, wherein the electrodes comprise a conductively doped anode slab coupled to the first layer, and a conductively doped cathode slab coupled to the second layer, wherein the slot and the first and second layers are coplanar rings of silicon.

* * * * *